(12) United States Patent
Gammel

(10) Patent No.: US 8,612,842 B2
(45) Date of Patent: Dec. 17, 2013

(54) APPARATUS FOR GENERATING A CHECKSUM

(75) Inventor: Berndt Gammel, Markt Schwaben (DE)

(73) Assignee: Infineon Technologies AG, Neubiberg (DE)

( * ) Notice: Subject to any disclaimer, the term of this patent is extended or adjusted under 35 U.S.C. 154(b) by 279 days.

(21) Appl. No.: 13/115,382

(22) Filed: May 25, 2011

(65) Prior Publication Data

US 2012/0304041 A1    Nov. 29, 2012

(51) Int. Cl.
*G06F 11/10* (2006.01)
*H03M 13/00* (2006.01)

(52) U.S. Cl.
USPC ............................. 714/807; 714/781

(58) Field of Classification Search
USPC ............ 714/781, 758, 752, 807, 723
See application file for complete search history.

(56) References Cited

U.S. PATENT DOCUMENTS

| | | | |
|---|---|---|---|
| 6,192,498 B1 * | 2/2001 | Arato | 714/781 |
| 6,560,727 B1 * | 5/2003 | Pierson et al. | 714/704 |
| 6,988,236 B2 * | 1/2006 | Ptasinski et al. | 714/758 |
| 7,124,351 B2 * | 10/2006 | Aldridge et al. | 714/781 |
| 7,168,033 B1 | 1/2007 | Wu et al. | |
| 7,500,174 B2 | 3/2009 | Sangster et al. | |
| 7,761,776 B1 | 7/2010 | Bataineh | |
| 2006/0015796 A1 | 1/2006 | Lamy | |
| 2009/0077453 A1 | 3/2009 | Jones, Jr. | |
| 2010/0042907 A1 * | 2/2010 | Pilsl | 714/782 |
| 2010/0169747 A1 * | 7/2010 | Chen et al. | 714/781 |

* cited by examiner

*Primary Examiner* — Phung M Chung
(74) *Attorney, Agent, or Firm* — Murphy, Bilak & Homiller, PLLC

(57) ABSTRACT

An apparatus generates a checksum for a payload having a number of payload symbols. The apparatus includes a coder for coding the payload. The coder is configured to combine a current payload symbol and a previous coding symbol or an initialization symbol to obtain a combined symbol, and map the combined symbol using a mapping rule to obtain a current coding symbol. The mapping rule is based on a power of two or more of a companion matrix of a characteristic polynomial of a linear feedback shift register. The apparatus is configured such that the checksum corresponds to the current coding symbol, when the number of payload symbols is processed by the coder, the number being one or greater than one.

29 Claims, 4 Drawing Sheets

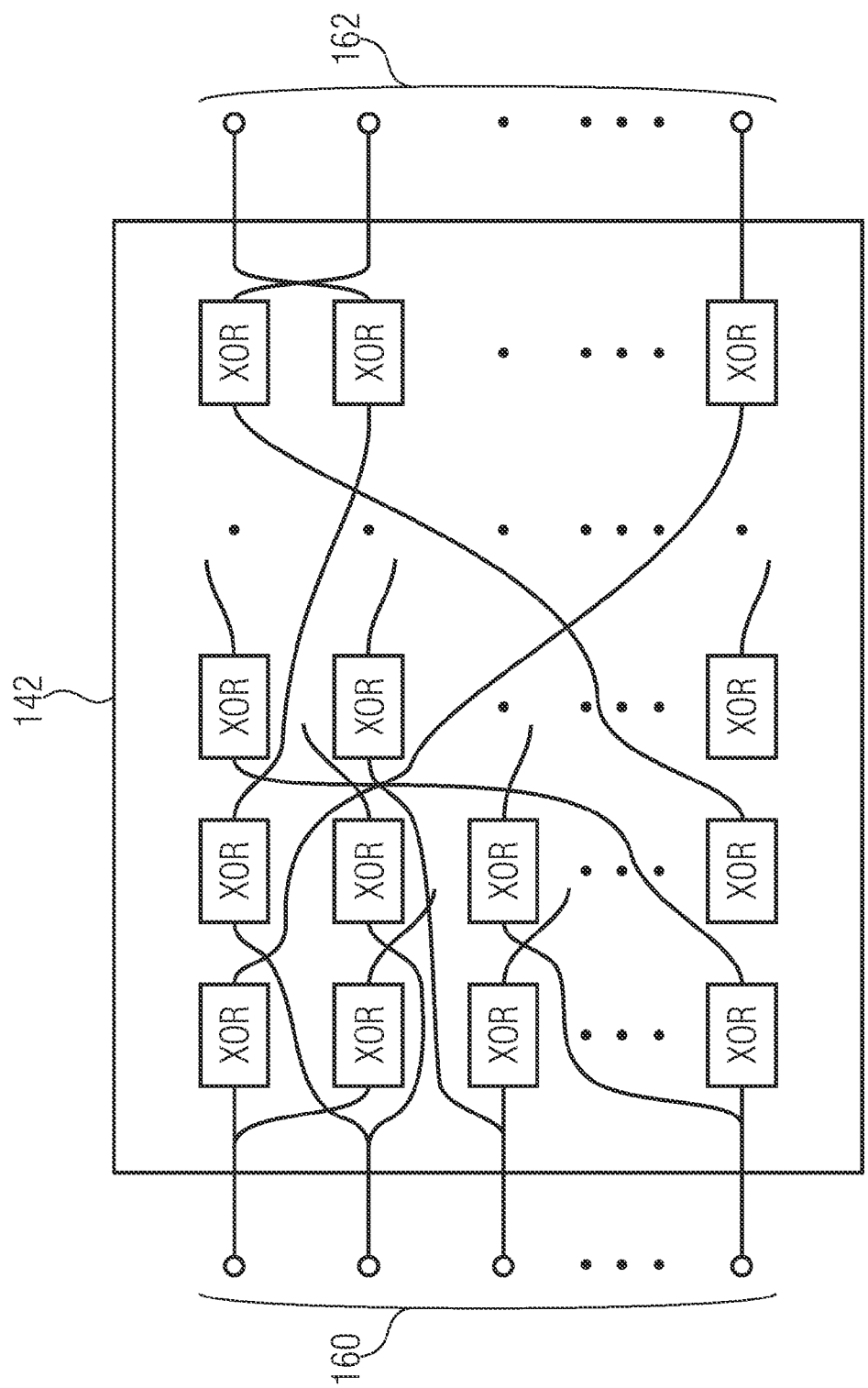

US 8,612,842 B2

APPARATUS FOR GENERATING A CHECKSUM

TECHNICAL FIELD

The present application relates to an apparatus for generating a checksum for a payload having a number of payload symbols, and more particularly to an adaptive high code distance checksum algorithm and module.

BACKGROUND

Digital error detection methods are based on information redundancy that generally can be described by an error detecting (or correcting) code. Moreover, a code that is able to process a payload having a variable number of payload symbols, e.g. a message, is referred to as checksum or checksum code.

SUMMARY

Embodiments described herein provide an apparatus for generating a checksum for a payload having a number of payload symbols. The apparatus includes a coder for coding the payload. The coder is configured to combine a current payload symbol and a previous coding symbol or an initialization symbol to obtain a combined symbol, and map the combined symbol using a mapping rule to obtain a current coding symbol. The mapping rule is based on a power of two or more of a companion matrix of a characteristic polynomial of a linear feedback shift register. The apparatus is configured such that the checksum corresponds to the current coding symbol, when the number of payload symbols is processed by the coder, the number being one or greater than one.

Further embodiments described herein provide an apparatus for generating a checksum for a payload having a number of payload symbols. The apparatus includes a combiner, a mapper and a register. The combiner is configured to combine a current payload symbol and a previous coding symbol or an initialization symbol to obtain a combined symbol. The mapper is configured to map the combined symbol using a mapping rule to obtain a current coding symbol, the mapping rule being based on a power of two or more of a companion matrix of a characteristic polynomial of a linear feedback shift register. The register is configured to store the current coding symbol and output the current coding symbol.

Further embodiments described herein provide a checksum processor for generating checksums for different payloads having different number of payload symbols. The checksum processor includes a first storage, a second storage, an apparatus for generating a checksum and a selector. The first storage is configured to store a first payload having a first number of payload symbols. The second storage is configured to store a second payload having a second number of payload symbols, the second number of payload symbols being greater than the first number of payload symbols. The apparatus for generating a checksum includes a coder for coding the payload and an input for the current payload symbol. The coder is configured to combine a current payload symbol and a previous coding symbol or an initialization symbol to obtain a combined symbol, and map the combined symbol using a mapping rule to obtain a current coding symbol. The mapping rule is based on a power of two or more of a companion matrix of a characteristic polynomial of a linear feedback shift register. The selector is configured to either couple the first storage or the second storage to the input of the apparatus. Moreover, the apparatus is configured to output a checksum for the first payload when the first storage is coupled to the input of the apparatus and the first number of payload symbols is processed, and to output a checksum for the second payload when the second storage is coupled to the input of the apparatus and the second number of payload symbols is processed.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4 shows a block diagram of a mapper having a parallel input and a parallel output according to an embodiment.

DETAILED DESCRIPTION

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Figure 1:
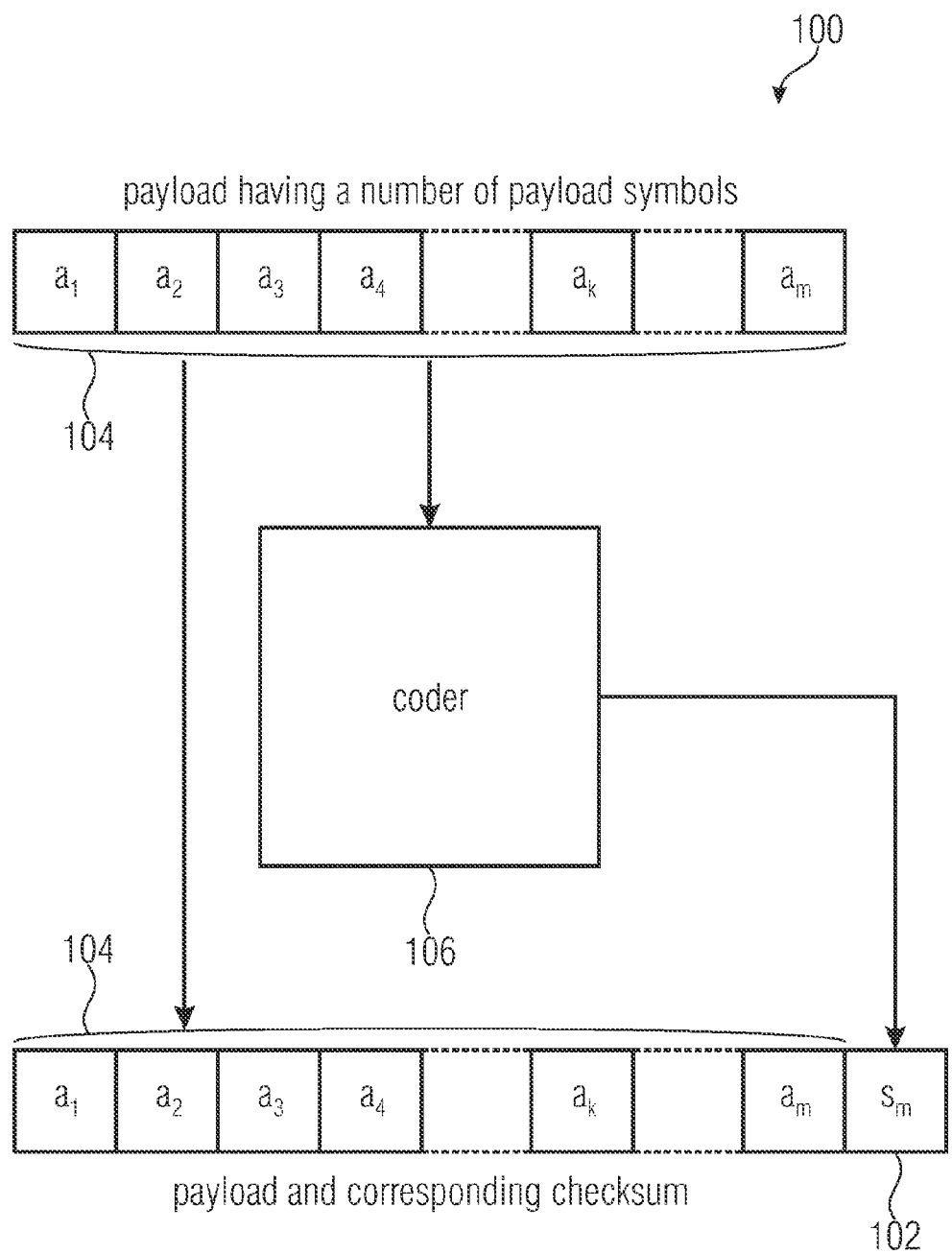
FIG. 1 shows a block diagram of an apparatus for generating a checksum for a payload having a number of payload symbols according to an embodiment.

FIG. 1 shows an apparatus 100 for generating a checksum 102 for a payload 104 having a number m of payload symbols $a_1$ to $a_m$ according to an embodiment. The apparatus 100 includes a coder 106 for coding the payload 104. The coder 106 is configured to combine a current payload symbol $a_k$ (k=1, ..., m) and a previous coding symbol $s^{k-1}$ or an initialization symbol $S_0$ to obtain a combined symbol, and to map the combined symbol using a mapping rule $C^q$ to obtain a current coding symbol $s^k$. The mapping rule $C^q$ is based on (or defined by) a power q of two or more (q≥2) of a companion matrix C of a characteristic polynomial p(x) of a linear feedback shift register (LFSR). Moreover, the apparatus 100 is configured such that the checksum $s^m$ (102) corresponds to the current coding symbol $s^k$, when the number m of payload symbols is processed by the coder 106 (when k=m), the number m being one or greater than one. In other words, the number m of payload symbols may be a natural number equal to or greater than one.

In some embodiments, the coder 106 of the apparatus 100 includes a feedback (path) for feeding back the previous coding symbol $s^{k-1}$ generated while coding the previous payload symbol $a_{k-1}$. The combination of the previous coding symbol $s^{k-1}$ and the current payload symbol $a_k$ generally provides distinct values even if there are similar or equal consecutive payload symbols $a_k$ and $a_{k-1}$.

In addition, the apparatus 100 can generate checksums for different payloads having different numbers of payload symbols, or in other words, the apparatus 100 can generate a checksum for a payload having a symbol sequence of variable length.

Moreover, by mapping the combined symbol to the current coding symbol $s^k$ using the mapping rule $C^p$ described herein, a variable or adaptive minimum code distance $d_{min}$ is provided. The minimum code distance $d_{min}$ depends on the number m of payload symbols, i.e. the checksum code has a high minimum code distance $d_{min}$ for a short payload (or short symbol sequence) and a low minimum code distance $d_{min}$ for a long payload (or long symbol sequence). Hence, the minimum code distance $d_{min}$ is a function of the number m of payload symbols, or in other words, of the length of the symbol sequence. Furthermore, it depends on the specific selection of the companion matrix C and the power p. That means, depending on the number of payload symbols m, the characteristic polynomial and the power $d_{min}(m,C,p)$ takes on different values. This is in contrast to the checksum algorithms well known to the experts in the field, like the CRC or Fletcher's checksum, etc., for which $d_{min}$ is constant for all lengths m<M, where M is some fixed maximum length. In case of the CCITT CRC-16 or IEEE 802.3 CRC-32, for example $d_{min}=4$ and for Fletcher's checksum $d_{min}=3$. To the contrary, the construction described herein uses powers of the companion matrix, which allows to achieve greater values of $d_{min}$ for short sequences, while still retaining a certain minimum value for long sequences.

In some embodiments, the coder 106 may be configured to combine the current payload symbol $a_k$ and the previous coding symbol $s^k$ or the initialization symbol $S_0$ using a linear combination. Furthermore, the coder 106 may include an XOR or XNOR gate for combining the current payload symbol $a_k$ and the previous coding symbol $S^{k-1}$ or the initialization symbol $S_0$.

Moreover, the current payload symbol $a_k$ and the previous coding symbol $s^{k-1}$ or the initialization symbol $s_0$ may include a plurality of symbol units (or bits). Thereby, the coder 106 may be configured to unit-wise (or bit-wise) combine the current payload symbol $a_k$ and the previous coding symbol $s^{k-1}$ or the initialization symbol $S_0$. The unit-wise (or bit-wise) combination of the current payload symbol $a_k$ and the previous coding symbol $s^{k-1}$ or the initialization symbol $S_0$ can be achieved by using parallel XOR or XNOR gates.

The coder 106 is also configured to map the combined symbol using a mapping rule $C^q$ to obtain the current coding symbol $s^k$ as previously described herein The mapping rule $C^q$ is based on (or defined by) a power q of two or more (q≥2) of a companion matrix C of a characteristic polynomial p(x) of a linear feedback shift register. In other words, the mapping rule $C^q$ is based on (or defined by) a companion matrix C to the power q of two or more (e.g. $C^2, C^3, C^4, C^5$, etc.), wherein the companion matrix C is defined by a characteristic polynomial p(x) of a linear feedback shift register. The characteristic polynomial p(x) of the linear feedback shift register may include a primitive polynomial g(x) or a primitive polynomial g(x) multiplied by a first degree polynomial such as x+1. Moreover, in some embodiments, the coder 106 might be configured to use a power q of the companion matrix C, the power q corresponding in symbol units (or bits) to a length h of the current coding symbol or a greater value (q>h). This guarantees, that every symbol unit (or bit) of the combined is combined (or mixed) with another symbol unit (or bit).

In addition, the coder 106 shown in FIG. 1 may include a (logic) circuit having an input for the combined symbol, an output for the current coding symbol $s^k$ and a plurality of XOR or XNOR gates coupled between the input and the output. The plurality of XOR or XNOR gates are coupled to each other such that the combined symbol at the input of the (logic) circuit is mapped to the current coding symbol $s^k$ at the output of the (logic) circuit according to the mapping rule $C^q$.

Furthermore, the apparatus 100 for generating a checksum 102 may include a register for storing the current coding symbol $s^k$ and for outputting the current coding symbol $s^k$. The current coding symbol $s^k$ stored in the register might be used in the next coding step while coding the next payload symbol $a_{k+1}$. In addition, the current coding symbol $s^k$ may be outputted as a checksum $s^m$ (parity symbol), when the number m of payload symbols is processed by the coder 106 (when k=m), in other words, when all payload symbols of the payload 104 are processed.

Figure 2:
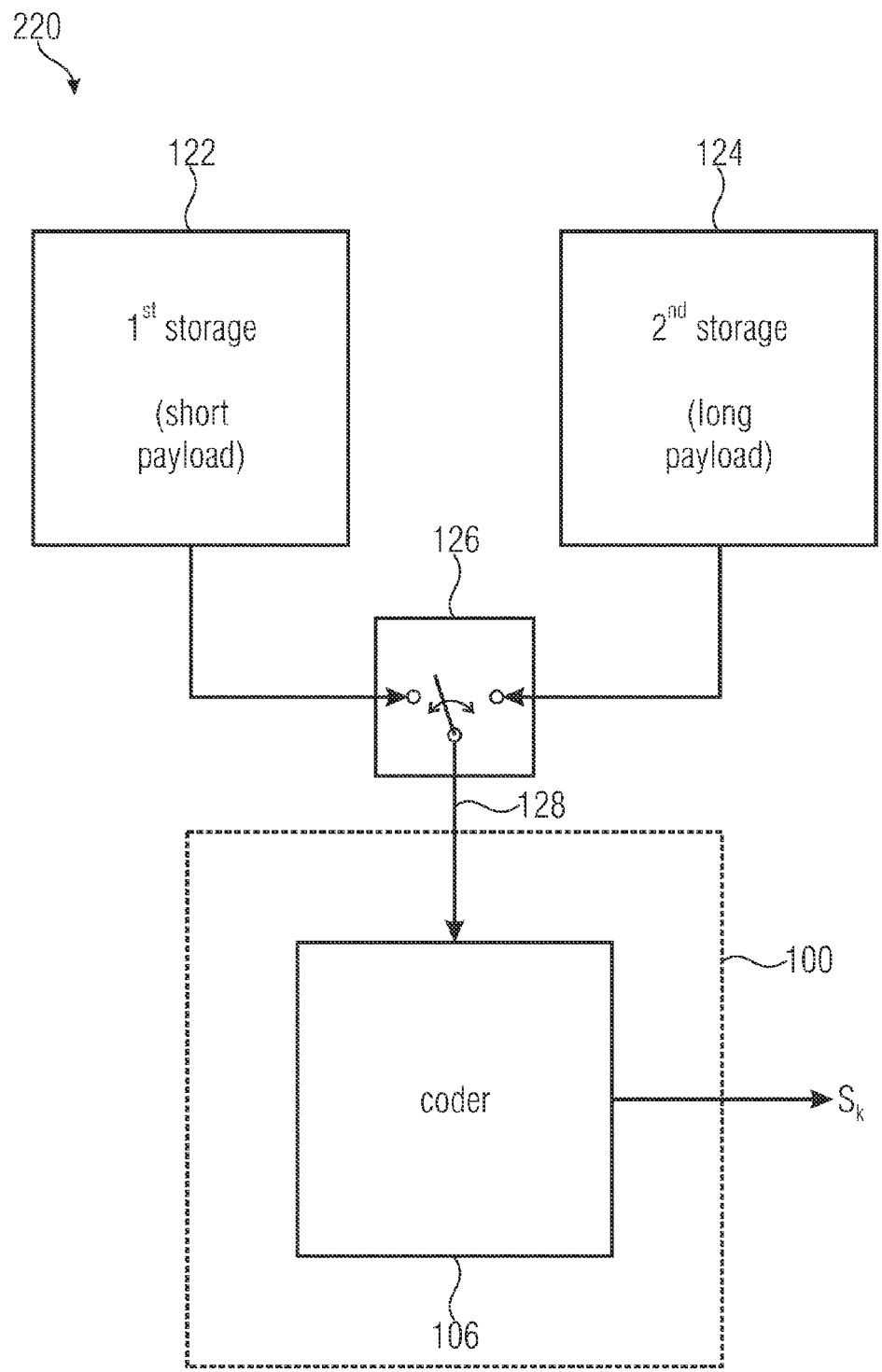
FIG. 2 shows a block diagram of a checksum processor according to an embodiment.

FIG. 2 shows a block diagram of a checksum processor 120 according to an embodiment. The checksum processor 120 is configured to generate checksums 102 for different payloads having different numbers of payload symbols. The checksum processor 120 includes a first storage 122, a second storage 124, the apparatus 100 for generating a checksum 102 as shown in FIG. 1 and a selector 126. The same coder 106 can be used for coding different payloads having different numbers of payload symbols independent on the length (number m of payload symbols $a_m$) of the payloads. In addition, the code generated by the coder 106 has the desirable property of an increasing minimum code distance $d_{min}$ for shorter (decreasing number of payload symbols $a_m$) payloads.

The first storage 122 is configured to store a first payload having a first number of payload symbols. The second storage 124 is configured to store a second payload having a second number of payload symbols, the second number of payload symbols being greater than the first number of payload symbols. In other words, the second payload is longer than the first payload.

Moreover, in some embodiments, a large storage including the first storage 122 and the second storage 124 may be used for storing the first payload having the first number of payload symbols and for storing second payload having the second number of payload symbols.

The apparatus 100 for generating a checksum 102 further includes an input 128 for the current payload symbol. The selector 126 is configured to either couple the first storage 122 or the second storage 124 to the input 128 of the apparatus 100. The checksum processor 120 provides a checksum for the first payload when the first storage 122 is coupled to the input 128 of the apparatus 100 and when the first number of payload symbols is processed, and a checksum for the second payload when the second storage 124 is coupled to the input 128 of the apparatus 100 and when the second number of payload symbols is processed.

The functionality of the apparatus 100 for generating a checksum 102 for a payload 104 having a number m of payload symbols as shown in FIGS. 1 and 2 might be described by a checksum code, or in other words, by a rule that converts the number m of payload symbols into a checksum 102.

The main characteristics of a checksum code are a length of the parity symbol (h), a minimum code distance (dmin), a maximum number of (payload) symbols for which the minimum code distance is valid (L), a probability that a (multiple) random error leads to a valid code word (p), a burst length detection (B) and/or hardware implementation characteristics such as required area and performance.

As already described above, the coder 106 is configured to provide a variable or adaptive (minimum) code distance $d_{min}$ that depends on the number of payload symbols, or in other words, the (minimum) code distance $d_{min}$ is a function of the number m of payload symbols. Hence, in the following, the checksum code is referred to as an adaptive high code distance checksum (AHDCS) code. The AHDCS code might be used for example, but not limited to, calculating data or instruction signatures for quantities of variable length on smart card security controllers.

A large number of known checksum codes are defined by international standards. Known or conventional checksum codes are, for example, CRC codes e.g. CRC16 and CRC32 (CRC=cyclic redundancy check), WSC codes, block parity codes, BCH codes (BCH=Bose, Ray-Chaudhuri and Hocquenghem), Reed-Solomon codes and Fletcher's checksum. Nevertheless, the use of a checksum code on a security controller (e.g. a smart card) as an error detection measure raises specific boundary conditions that none of the aforementioned checksum codes fulfills. In stark contrast, the AHDCS code fulfills the boundary conditions for being used on a security controller as an error detection measure as described in more detail next.

The AHDCS code fulfills the boundary condition of an asymptotic maximum probability p that a (multiple) random error leads to a valid code word for a given length h of the parity symbol, i.e. $p=2^{-h}$. Furthermore, the AHDCS code fulfills the boundary condition of a maximum burst length b for a given length h of the parity symbol, i.e. b=h. In addition, the AHDCS code fulfills the boundary condition of a preferably large (minimum) code distance $d_{min}$ as a function of the maximum number of symbols L (dmin(L)), for L being a natural number equal to or greater than one (L=1, 2, 3, ... ), i.e. $d_{min}(L1) > d_{min}(L2) > d_{min}(L3) >> d_{min}(Ln)$ for L1<L2<L3<...<Ln. Moreover, the AHDCS code fulfills the boundary condition of a reduced or even minimized hardware implementation area. Furthermore, the AHDCS is parallelizable such that an h-bit word or symbol might be processed or coded within one coding step.

In contrast, the characteristics of the above mentioned known checksum codes are briefly described in the following. Moreover, in the following examples, the length of the parity symbol is exemplarily chosen to be 16 bit (h=16 bit).

Fletcher's code (in particular Fletcher 255) has a small (minimum) code distance $d_{min}=3$ bits for a suboptimal maximum number of symbols L=128, a suboptimal probably p=0.001538% that a (multiple) random error leads to a valid code word and a suboptimal burst length b=7 bits. In theory, L=2047, $p=2^{-16}$ and b=16 bits would be possible.

WSC codes and block parity codes also have strongly suboptimal error detection characteristics, or in other words, a small (minimum) code distance $d_{min}$. Furthermore, Reed-Solomon codes and BCH codes generally require very complex encoders and decoders and also have suboptimal error detection characteristics, or in other words, a small (minimum) code distance $d_{min}$.

The CRC16 code (CCITT (CCITT=International Telegraph and Telephone Consultative Committee) or XBM) has a (minimum) code distance of $d_{min}=4$ bits for up to L=2047 symbols (optimal). In theory, $d_{min}=3$ bits for up to L=4094 symbols, $d_{min}=4$ bits for up to L=2047 symbols, $d_{min}=5$ bits for up to L=15 symbols, $d_{min}=6$ bits for up to L=8 symbols and $d_{min}=7$ bits and $d_{min}=8$ bits for L=1 symbol would be possible. Thus, the standard CRC codes are not adaptive meaning that the (minimum) code distance $d_{min}$ does not increase for shorter symbol sequences. In addition, CRC codes are basically defined sequentially, i.e. a parallelization for processing a 16 bit word or symbol in one coding step is principally possible, but would require a large hardware area which in turn would lead to a high energy consumption.

Moreover, in the context of data and instruction signatures as counter measures against fault attacks, it is very important to use a checksum code that has a higher (minimum) code distance $d_{min}$ for shorter symbol sequences in order to detect as many multi bit errors as possible due to that short data or instruction sequences might be located simultaneously in a local buffer that may be affected by a local attack, e.g. with a laser. As already described in detail, in contrast to known checksum codes, the AHDCS code can provide a higher (minimum) code distance $d_{min}$ for shorter symbol sequences.

In addition, in the context of transmission protocols with protocol frames having a variable length (which is usually the case), it is advantageous to use a checksum code that has a higher (minimum) code distance $d_{min}$ for shorter symbol sequences. When shorter protocol frames are transmitted (which is generally the most frequent case), the error detection rate is automatically increased. Thus, the average overall error rate can be reduced.

The theoretically trivial possibility to use different but respectively optimal codes for different lengths of symbol sequences cannot be considered at all for practical reasons. On the one hand, the length of the symbol sequences has to be known before starting the calculation and the length information for selecting the code would always have to be given. On the other hand, about one dozen different algorithms would have to be implemented and a dynamic switching between the same would have to be performed.

The AHDCS code has a dynamic adjustment of the (minimum) code distance $d_{min}$ to the number m of symbol units (length). Furthermore, the AHDCS code provides the possibility of a simple homogenous hardware implementation. Thereby, no switching between codes having different (minimum) code distances takes place. This characteristic is inherently contained within the construction of the AHDCS code. Moreover, the AHDCS code can be efficiently parallelized. In addition, burst length b and asymptotic error detection probability p are enhanced (or even optimal) in comparison to the above mentioned conventional known codes.

The AHDCS may be defined by the dynamic equation given by:

$$s^k = C^q(s^{k-1} + \alpha k) \quad (1)$$

for k=1, 2, ..., m. The "+" symbol in equation (1) denotes modulo 2 addition (XOR). The state vector after coding the sequence of k payload (or message) symbols ($a_1$, $a_2$, $a_k$) is denoted with $s^k$ and may have a width of h-bit (e.g. h=16). After coding (or hashing) all m payload symbols, the parity check symbol is given by the value $s^m$. The payload (or message) symbols $a_i$ may also have a length of h-bit. The matrix C is a companion matrix of a linear feedback shift register and may have a dimension of h×h. In the dynamic equation of the AHDCS the matrix C is raised to the power of q, where in some embodiments q is equal to or greater than h (q≥h). Moreover, the companion matrix C is based on (or defined) by the characteristic polynomial p(x) of a linear feedback shift register. Thereby, two possibilities are relevant as given by:

$$p(x) = g(x) \quad (2)$$

$$p(x) = (x+1)g(x) \quad (3)$$

where g(x) is a primitive polynomial. For p(x)=g(x) the code distance is guaranteed to be three ($d^*_{min}=3$) for the maximum length L. For p(x)=(x+1)g(x) the code distance is guaranteed to be four ($d^*_{min}=4$) for the maximum length L. In the following, $d^*_{min}$ is referred to as standard distance.

By choosing the remaining free parameter, namely the primitive polynomial g(x), different realizations of AHDCS may be obtained. For payloads having a small number of payload symbols many polynomials g(x) lead to a checksum code that has a higher code distance than the standard distance $d^*_{min}$.

In addition, a high code distance can be provided for payloads having a small number of payload symbols for selected g(x) according to some embodiments. For example, assuming h=16 bit and p(x)=c5c0$_{(hex)}$ (equation (2)) the AHDCS provides a minimum code distance $d_{min}$=4 bits for L 52 symbols, $d_{min}$=5 bits for L 5 symbols and $d_{min}$=7 bits for L1 symbols, where h is the length of the data and parity symbols and L is the maximum number of payload symbols for which the minimum code distance is valid. For longer parity symbols very high code distances are provided, e.g. $d_{min}$>10 bits.

In some embodiments, a polynomial of the companion matrix C can be used instead of the factor $C^q$ in equation (1). In that case, the AHDCS may be generally defined by the dynamic equation:

$$s^k = (\alpha C^q + \alpha_{q-1} C^{q-1} + \ldots + \alpha_2 C^2 + \alpha_1 C^1 + \alpha_1 C^1 + \alpha_0 I)(s^{k-1} + \alpha_k) \quad (4)$$

where I is the identity matrix (corresponding to the zero-th power of C) and q is as before equal to or greater than two (q≥2). Moreover, in the binary case, $a_q$ can be a logical zero or a logical one (in the general case any number). In other words, the mapping rule may be based on a weighted sum of the i-th powers of the companion matrix C, where at least one term with a power i≥2 is present. In other words, the mapping rule may be based on a weighted sum of the power q of two or more of the companion matrix C and a different power of the companion matrix C, the different power of the companion matrix C including zero.

Furthermore, in some embodiments, the power q of the companion matrix C can be variable (not constant). Thereby, the power q of the companion matrix C can be a function of k ($C^{q(k)}$), e.g. after having processed a first sub-number of payload symbols with a first power of the companion matrix C, the coder 106 can switch to a second power of the companion matrix for coding a second sub-number of payload symbols, and so on. In other words, the mapping rule $C^{q(k)}$ can be based on (or defined by) a power q of two or more of the companion matrix C for a first sub-number of payload symbols and on a different power of the companion matrix C for a second sub-number of payload symbols, where the first sub-number of payload symbols added to the second sub-number of payload symbols results in the number of payload symbols or is smaller than the number of payload symbols.

In addition, the two above mentioned embodiments can be combined. Thereby, all powers and/or coefficients in equation (4) can be a function of k, e.g. after having processed a first sub-number of payload symbols the coder 106 may add a q-th power of the companion matrix C to the weighted sum of the mapping rule.

Moreover, a hardware implementation of the AHDCS code usually requires less area than a conventional parallel CRC code providing a parity symbol with the same width h.

Figure 3:
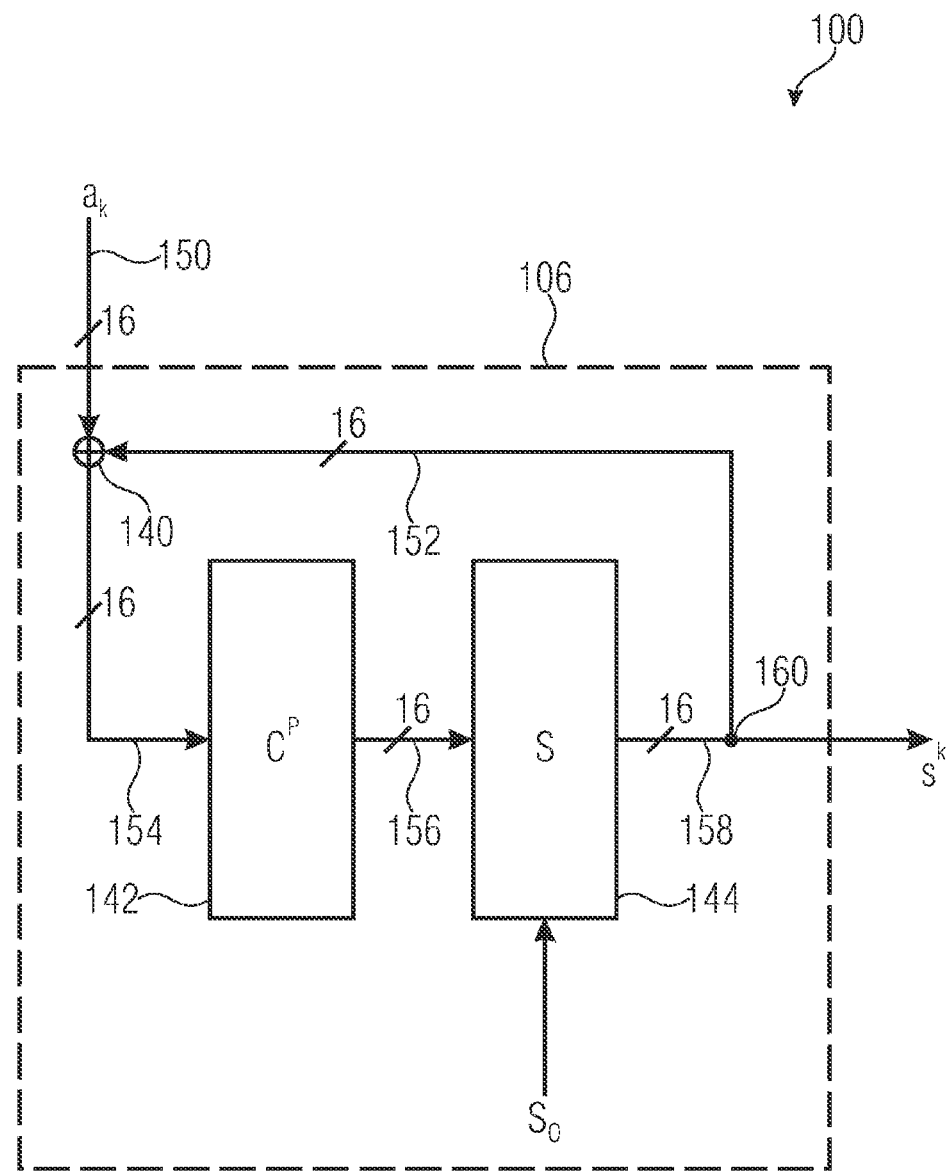
FIG. 3 shows a block diagram of an apparatus for generating a checksum for a payload having a number of payload symbols according to an embodiment.

FIG. 3 shows a block diagram of an apparatus 100 for generating a checksum 102 for a payload 104 having a number m of payload symbols according to another embodiment. The apparatus 100 includes a combiner 140, a mapper 142 and a register 144.

In some embodiments, the coder 106 of the apparatus 100 for generating a checksum 102 for a payload 104 having a number of payload symbols as shown in FIG. 1 may include the combiner 140, the mapper 142 and the register 144 as described below.

The combiner 140 is configured to combine a current payload symbol $a_k$ and a previous coding symbol $s^{k-1}$ or an initialization symbol $S_0$ to obtain a combined symbol.

The mapper 142 is configured to map the combined symbol using a mapping rule $C^q$ to obtain a current coding symbol, where the mapping rule $C^q$ is based on (or defined by) a power q of two or more (q≥2) of a companion matrix C for a characteristic polynomial p(x) of a linear feedback shift register.

The register 144 is configured to store the current coding symbol $s^k$ and output the current coding symbol $s^k$. The current coding symbol $s^k$ stored in the register 144 can be used in the next coding step while coding the next payload symbol $a_{k+1}$. In addition, the current coding symbol $s^k$ can be outputted as a checksum $s^m$ (parity symbol), when the number m of payload symbols is processed by the coder 106 (when k=m), in other words, when all payload symbols of the payload are processed.

In some embodiments, the combiner 140 is configured to combine the current payload symbol $a_k$ and the previous coding symbol $s^{k-1}$ or the initialization symbol $S_0$ using a linear combination. Furthermore, the combiner 140 may include an XOR or XNOR gate for combining the current payload symbol $a_k$ and the previous coding symbol $s^{k-1}$ or the initialization symbol $S_0$.

Moreover, as already mentioned, the current payload symbol $a_k$ and the previous coding symbol $S^{k-1}$ or the initialization symbol $S_0$ may include a plurality of symbol units (or bits). Thereby, the combiner 140 may be configured to unit-wise (or bit-wise) combine the current payload symbol $a_k$ and the previous coding symbol $S^{k-1}$ or the initialization symbol $S_0$.

In some embodiments, the mapper 142 is configured to map the combined symbol using a mapping rule $C^q$ to obtain the current coding symbol. The mapping rule $C^q$ is based on (or defined by) a companion matrix C to the power q of two or more (e.g. $C^2$, $C^3$, $C^4$, $C^5$, etc.), where the companion matrix C is defined by a characteristic polynomial p(x) of a linear feedback shift register. The characteristic polynomial p(x) of the linear feedback shift register may include a primitive polynomial g(x) or a primitive polynomial g(x) multiplied by a first degree polynomial such as x+1. Moreover, in some embodiments, the coder 106 might be configured to use a power q of the companion matrix C, the power q corresponding in symbol units (or bits) to a length h of the current coding symbol or more (q>h).

In some embodiments, the initial value $S_0$ may be loaded into an h-bit register 144. For each new (payload) symbol $a_k$, the value of $s^k$ stored in the register 144 is read and linked with the (payload) symbol $a_k$ using an XOR gate, the linear map $C^q$ is applied thereon and the result is loaded (or written) back into the register 144.

As already mentioned, in some embodiments, the current payload symbol $a_k$ and the previous coding symbol $s^{k-1}$ may include a number of symbol units (or bits). In that case, the apparatus 100 may have a first parallel bus 150, a second parallel bus 152, a unit-wise parallel combiner 140, a third parallel bus 154, a mapper 142 having a parallel input and a parallel output, a fourth parallel bus 156, a register 144 having a parallel input and a parallel output, a fifth parallel bus 158 and a branch 160.

In FIG. 3, the number of symbol units (or bits) is exemplarily chosen to be 16. Naturally, the following description is also applicable to embodiments having a different number of symbol units, e.g. 2, 4, 8, 16, 32, 64 or 128 or even 1024.

The first parallel bus 150 may have a plurality of individual lines equal to the number of symbol units (or bits) for carrying the current payload symbol $a_k$. The second parallel bus 152 may have a plurality of individual lines equal to the number of symbol units (or bits) for carrying the previous coding symbol $s_{k-1}$ or the initialization symbol $S_0$;

The unit-wise (bit-wise) parallel combiner 140 is configured to combine unit-wise (bit-wise) the current payload symbol $a_k$ and the previous coding symbol $s^{k-1}$ or the initialization symbol $S_0$ to obtain the combined symbol, where the combined symbol has the same number of symbol units (or bits).

The third parallel bus 154 may have a plurality of individual lines equal to the number of symbol units (or bits) for carrying the combined symbol.

The mapper 142 has a parallel input for the combined symbol, a parallel output for the current coding symbol $s^k$ and a plurality of XOR or XNOR gates coupled between the parallel input and the parallel output. Thereby, the plurality of XOR or XNOR gates are coupled to each other such that the combined symbol at the parallel input is mapped to the current coding symbol $s^k$ at the parallel output according to the mapping rule $C^q$, where the current coding symbol has the same number of symbol units (or bits).

The fourth parallel bus 156 may have a plurality of individual lines equal to the number of symbol units (or bits) for carrying the current coding symbol $s^k$.

The register 144 has a parallel input and a parallel output and may be configured to store the current coding symbol $s^k$ and output the current coding symbol $s^k$.

The fifth parallel bus 158 may have a plurality of individual lines equal to the number of symbol units (or bits) for carrying the current coding symbol $s^k$. The branch 160 is configured to parallel couple the fifth parallel bus 158 and the second parallel bus 152.

FIG. 4 shows a block diagram of the mapper 142 having a parallel input 162 and a parallel output 164 according to an embodiment. The mapper 142 includes a plurality of XOR or XNOR gates coupled between the parallel input 162 and the parallel output 164, where the plurality of XOR or XNOR gates are coupled to each other such that the combined symbol at the input 162 is mapped to the current coding symbol $s^k$ at the output 164 according to the mapping rule $C^q$. In FIG. 4, by example, only XOR gates are shown. Naturally, instead of the XOR gates XNOR gates or a combination thereof may be used.

In some embodiments, the apparatus 100 for generating a checksum 102 for a payload 104 having a number of payload symbols may be used for protecting messages that are transmitted over a communication channel, or in other words, for detecting and/or correcting errors that may occur while transmitting messages of the communication channel. Thereby, the apparatus 100 may be used on the coder and/or decoder side.

Moreover, in some embodiments, the apparatus 100 for generating a checksum 102 for a payload 104 having a number of payload symbols may be used in a microprocessor e.g. for protecting data or program code. Thereby, the apparatus 100 for generating a checksum might be used as coder and decoder in turn. Alternatively, the apparatus 100 for generating a checksum might be used as a dedicated coder or decoder, wherein two apparatuses 100 might be used for coding and decoding, respectively.

Further embodiments provide a method for generating a checksum for a payload having a number of payload symbols. In a first step, a current payload symbol and a previous coding symbol or an initialization symbol are combined to obtain a combined symbol. In a second step, the combined symbol is mapped using a mapping rule to obtain a current coding symbol. The mapping rule is based on (or defined by) a power of two or more of a companion matrix of a characteristic polynomial of a linear feedback shift register. In a third step, it is indicated as to whether the checksum corresponds to the current coding symbol. The checksum corresponds to the current coding symbol, when the number of payload symbols is processed by the coder, the number being one or greater than one.

In some embodiments, a linear combination is used for combining the current payload symbol and the previous coding symbol or the initialization symbol. Moreover, a XOR or XNOR operation may be used for combining the current payload symbol and the previous coding symbol or the initialization symbol. In addition, the current payload symbol and the previous coding symbol or the initialization symbol may include a number of symbol units (or bits), where a unit-wise (or bit-wise) combination may be used for combining the current payload symbol and the previous coding symbol or the initialization symbol.

Furthermore, the characteristic polynomial of the linear feedback shift register may include a primitive polynomial or a primitive polynomial multiplied by a first degree polynomial.

In some embodiments, the current coding symbol has a plurality of symbol units (or bits). In addition, the step of mapping (second step) may include using a power of the companion matrix, the power corresponding in symbol units (or bits) to a length of the current coding symbol or more.

Moreover, embodiments provide a computer readable digital storage medium having stored thereon a computer program having a program code for performing, when running on a computer, a method for generating a checksum for a payload having a number of payload symbols. In a first step, a current payload symbol and a previous coding symbol or an initialization symbol are combined to obtain a combined symbol. In a second step, the combined symbol is mapped using a mapping rule to obtain a current coding symbol. The mapping rule is based on (or defined by) a power of two or more of a companion matrix of a characteristic polynomial of a linear feedback shift register. In a third step, it is indicated as to whether the checksum corresponds to the current coding symbol. The checksum corresponds to the current coding symbol, when the number of payload symbols is processed by the coder, the number being one or greater than one.

Further embodiments provide a means for generating a checksum for a payload having a number of payload symbols. The means for generating includes a means for combining a current payload symbol and a previous coding symbol or a initialization symbol to obtain a combined symbol; and a means for mapping the combined symbol using a mapping rule to obtain a current coding symbol, where the mapping rule is based on (or defined by) a power of two or more of a companion matrix for a characteristic polynomial of a linear feedback shift register. The checksum corresponds to the current coding symbol, when the number of payload symbols is processed by the coder, the number being one or greater than one.

Although some aspects have been described in the context of an apparatus, it is clear that these aspects also represent a description of the corresponding method, where a block or device corresponds to a method step(s) or a feature of a method step(s). Analogously, aspects described in the context of a method step also represent a description of a corresponding block(s) or item or feature of a corresponding apparatus. Some or all of the method steps may be executed by (or using)

a hardware apparatus, like for example, a microprocessor, a programmable computer or an electronic circuit. In some embodiments, some one or more of the most important method steps may be executed by such an apparatus.

Depending on certain implementation requirements, embodiments can be implemented in hardware or in software. The implementation can be performed using a digital storage medium, for example a floppy disk, a DVD, a Blu-ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments include a data carrier having electronically readable control signals, which are capable of cooperating with a programmable computer system, such that one of the methods described herein is performed.

Generally, embodiments can be implemented as a computer program product with a program code, the program code being operative for performing one of the methods when the computer program product runs on a computer. The program code may for example be stored on a machine readable carrier.

Other embodiments include the computer program for performing one of the methods described herein, stored on a machine readable carrier. In other words, the computer program has a program code for performing one of the methods described herein, when the computer program runs on a computer.

A further embodiment includes a data carrier (or a digital storage medium, or a computer-readable medium) having, recorded thereon, the computer program for performing one of the methods described herein. The data carrier, the digital storage medium or the recorded medium are typically tangible and/or non transitionary.

A further embodiment includes a data stream or a sequence of signals representing the computer program for performing one of the methods described herein. The data stream or the sequence of signals may for example be configured to be transferred via a data communication connection, for example via the Internet.

A further embodiment includes a processing means, for example a computer, or a programmable logic device, configured to or adapted to perform one of the methods described herein.

A further embodiment includes a computer having installed thereon the computer program for performing one of the methods described herein.

A further embodiment includes an apparatus or a system configured to transfer (for example, electronically or optically) a computer program for performing one of the methods described herein to a receiver. The receiver may, for example, be a computer, a mobile device, a memory device or the like. The apparatus or system may, for example, include a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

Terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An apparatus for generating a checksum for a payload having a number of payload symbols, the apparatus comprising:
   a coder for coding the payload, wherein the coder is configured to combine a current payload symbol and a previous coding symbol or a initialization symbol to obtain a combined symbol, and map the combined symbol using a mapping rule to obtain a current coding symbol, the mapping rule being based on a power of two or more of a companion matrix of a characteristic polynomial of a linear feedback shift register;
   wherein the apparatus is configured such that the checksum corresponds to the current coding symbol, when the number of payload symbols is processed by the coder, the number being one or greater than one,
   wherein for the case of the number being one, the coder is configured to combine the current payload symbol with the initialization symbol.

2. The apparatus according to claim 1, wherein the mapping rule is based on a weighted sum of the powers of the companion matrix, and wherein at least one term with a power greater or equal than two is present, a term with the zero-th power also being allowed.

3. The apparatus according to claim 1, wherein the mapping rule is based on a power of two or more of the companion matrix for a first sub-number of payload symbols and on a different power of the companion matrix for a second sub-number of payload symbols, and wherein the first sub-number of payload symbols added to the second sub-number of payload symbols results in the number of payload symbols or is smaller than the number of payload symbols.

4. The apparatus according to claim 1, wherein the coder is configured to combine the current payload symbol and the previous coding symbol or the initialization symbol using a linear combination.

5. The apparatus according to claim 1, wherein the coder comprises an XOR or XNOR gate configured to combine the current payload symbol and the previous coding symbol or the initialization symbol.

6. The apparatus according to claim 1, wherein the current payload symbol and the previous coding symbol or the initialization symbol comprise a plurality of symbol units, and wherein the coder is configured to unit-wise combine the current payload symbol and the previous coding symbol or the initialization symbol.

7. The apparatus according to claim 1, wherein the characteristic polynomial of the linear feedback shift register comprises a primitive polynomial or a primitive polynomial multiplied by a first degree polynomial.

8. The apparatus according to claim 1, wherein the current coding symbol comprises a plurality of symbol units, and wherein the coder is configured to use a power of the companion matrix, the power corresponding in symbol units to a length of the current coding symbol or more.

9. The apparatus according to claim 1, wherein the coder comprises a circuit having an input for the combined symbol, an output for the current coding symbol and a plurality of XOR or XNOR gates coupled between the input and the output, wherein the plurality of XOR or XNOR gates are coupled to each other such that the combined symbol at the input is mapped to the current coding symbol at the output according to the mapping rule.

10. The apparatus according to claim 1, further comprising a register configured to store the current coding symbol and output the current coding symbol.

11. A checksum processor for generating checksums for different payloads having different number of payload symbols, the checksum processor comprising:
a first storage configured to store a first payload having a first number of payload symbols;
a second storage configured to store a second payload having a second number of payload symbols, the second number of payload symbols being greater than the first number of payload symbols;
an apparatus for generating a checksum, the apparatus comprising:
an input;
a selector configured to couple the first storage or the second storage to the input; and
a coder configured to combine a current payload symbol and a previous coding symbol or a initialization symbol to obtain a combined symbol, and map the combined symbol using a mapping rule to obtain a current coding symbol, the mapping rule being based on a power of two or more of a companion matrix of a characteristic polynomial of a linear feedback shift register; and
wherein the apparatus is configured to output a checksum for the first payload when the first storage is coupled to the input of the apparatus and the first number of payload symbols is processed, and to output a checksum for the second payload when the second storage is coupled to the input of the apparatus and the second number of payload symbols is processed.

12. An apparatus for generating a checksum for a payload having a number of payload symbols, the apparatus comprising:
a combiner configured to combine a current payload symbol and a previous coding symbol or an initialization symbol to obtain a combined symbol;
a mapper configured to map the combined symbol using a mapping rule to obtain a current coding symbol, wherein the mapping rule is based on a power of two or more of a companion matrix of a characteristic polynomial of a linear feedback shift register; and
a register configured to store the current coding symbol and output the current coding symbol,
wherein the apparatus is configured such that the checksum corresponds to the current coding symbol, when the number of payload symbols is processed by the mapper, the number being one or greater than one,
wherein for the case of the number being one, the combiner is configured to combine the current payload symbol with the initialization symbol.

13. The apparatus according to claim 12, wherein the mapping rule is based on a power of two or more of the companion matrix for a first sub-number of payload symbols and on a different power of the companion matrix for a second sub-number of payload symbols, and wherein the first sub-number of payload symbols added to the second sub-number of payload symbols results in the number of payload symbols or is smaller than the number of payload symbols.

14. The apparatus according to claim 12, wherein the combiner is configured to combine the current payload symbol and the previous coding symbol or the initialization symbol using a linear combination.

15. The apparatus according to claim 12, wherein the combiner comprises an XOR or XNOR gate configured to combine the current payload symbol and the previous coding symbol or the initialization symbol.

16. The apparatus according to claim 12, wherein the current payload symbol and the previous coding symbol or the initialization symbol comprise a plurality of symbol units, and wherein the combiner is configured to unit-wise combine the current payload symbol and the previous coding symbol or the initialization symbol.

17. The apparatus according to claim 12, wherein the characteristic polynomial of the linear feedback shift register comprises a primitive polynomial or a primitive polynomial multiplied by a first degree polynomial.

18. The apparatus according to claim 12, wherein the current coding symbol comprises a plurality of symbol units, and wherein the mapper is configured to use a power of the companion matrix, the power corresponding in symbol units to a length of the current coding symbol or more.

19. The apparatus according to claim 12, wherein the mapper comprises an input for the combined symbol, an output for the current coding symbol and a plurality of XOR or XNOR gates coupled between the input and the output, and wherein the plurality of XOR or XNOR gates are coupled to each other such that the combined symbol at the input is mapped to the current coding symbol at the output according to the mapping rule.

20. The apparatus according to claim 12, wherein the current payload symbol and the previous coding symbol comprise a number of symbol units, and wherein the coder comprises:
a first parallel bus having a plurality of individual lines equal to the number of symbol units for carrying the current payload symbol;
a second parallel bus having a plurality of individual lines equal to the number of symbol units for carrying the previous coding symbol or the initialization symbol;
an unit-wise parallel combiner configured to combine the current payload symbol and the previous coding symbol or the initialization symbol to obtain the combined symbol, wherein the combined symbol comprises the number of symbol units;
a third parallel bus having a plurality of individual lines equal to the number of symbol units for carrying the combined symbol;
a mapper having an parallel input for the combined symbol, an parallel output for the current coding symbol and a plurality of XOR or XNOR gates coupled between the parallel input and the parallel output, wherein the plurality of XOR or XNOR gates are coupled to each other such that the combined symbol at the parallel input is mapped to the current coding symbol at the parallel output according to the mapping rule, wherein the current coding symbol comprises the number of symbol units;

a fourth parallel bus having a plurality of individual lines equal to the number of symbol units for carrying the current coding symbol;

a parallel register configured to store the current coding symbol and output the current coding symbol;

a fifth parallel bus having a plurality of individual lines equal to the number of symbol units for carrying the current coding symbol; and a branch configured to parallel couple the fifth parallel bus and the second parallel bus.

21. An apparatus for generating a checksum for a payload having a number of payload symbols, the apparatus comprising:

a means for combining a current payload symbol and a previous coding symbol or an initialization symbol to obtain a combined symbol;

a means for mapping the combined symbol using a mapping rule to obtain a current coding symbol, the mapping rule being based on a power of two or more of a companion matrix of a characteristic polynomial of a linear feedback shift register; and wherein the checksum corresponds to the current coding symbol, when the number of payload symbols is processed by the means for mapping, the number being one or greater than one, wherein for the case of the number being one, the current payload symbol is combined with the initialization symbol.

22. A method for generating a checksum for a payload having a number of payload symbols, the method comprising:

combining a current payload symbol and a previous coding symbol or an initialization symbol to obtain a combined symbol; and mapping the combined symbol using a mapping rule to obtain a current coding symbol, the mapping rule being based on a power of two or more of a companion matrix of a characteristic polynomial of a linear feedback shift register, wherein the checksum corresponds to the current coding symbol, when the number of payload symbols is processed by the mapping, the number being one or greater than one, wherein for the case of the number being one, the current payload symbol is combined with the initialization symbol.

23. The method according to claim 22, wherein the mapping rule is based on a power of two or more of the companion matrix for a first sub-number of payload symbols and on a different power of the companion matrix for a second sub-number of payload symbols, and wherein the first sub-number of payload symbols added to the second sub-number of payload symbols results in the number of payload symbols or is smaller than the number of payload symbols.

24. The method according to claim 22, wherein combining the current payload symbol and the previous coding symbol or the initialization symbol to obtain the combined symbol comprises using a linear combination for combining the current payload symbol and the previous coding symbol or the initialization symbol.

25. The method according to claim 22, wherein combining the current payload symbol and the previous coding symbol or the initialization symbol to obtain the combined symbol comprises using an XOR or XNOR operation for combining the current payload symbol and the previous coding symbol or the initialization symbol.

26. The method according to claim 22, wherein the current payload symbol and the previous coding symbol or the initialization symbol comprise a number of symbol units, and wherein combining the current payload symbol and the previous coding symbol or the initialization symbol to obtain the combined symbol comprises unit-wise combining the current payload symbol and the previous coding symbol or the initialization symbol.

27. The method according to claim 22, wherein the characteristic polynomial of the linear feedback shift register comprises a primitive polynomial or a primitive polynomial multiplied by a first degree polynomial.

28. The method according to claim 22, wherein the current coding symbol comprises a plurality of symbol units, and wherein mapping the combined symbol using the mapping rule to obtain the current coding symbol comprises using a power of the companion matrix, the power corresponding in symbol units to a length of the current coding symbol or more.

29. A non-transitory computer readable digital storage medium having stored thereon a computer program having a program code for performing, when running on a computer, a method for generating a checksum for a payload having a number of payload symbols, the method comprising:

combining a current payload symbol and a previous coding symbol or an initialization symbol to obtain a combined symbol; and mapping the combined symbol using a mapping rule to obtain a current coding symbol, the mapping rule being based on a power of two or more of a companion matrix of a characteristic polynomial of a linear feedback shift register, wherein the checksum corresponds to the current coding symbol, when the number of payload symbols is processed by the mapping, the number being one or greater than one, wherein for the case of the number being one, the current payload symbol is combined with the initialization symbol.

* * * * *